(12) United States Patent
Sakuma (10) Patent No.: US 9,851,233 B2
(45) Date of Patent: Dec. 26, 2017

(54) PHYSICAL QUANTITY SENSOR (71) Applicant: Hitachi Automotive Systems, Ltd., Hitachinaka-shi, Ibaraki (JP)

(72) Inventor: Noriyuki Sakuma, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 25 days.

(21) Appl. No.: 14/652,487

(22) PCT Filed: Oct. 15, 2013

(86) PCT No.: PCT/JP2013/077878
§ 371 (c)(1),
(2) Date: Jun. 16, 2015

(87) PCT Pub. No.: WO2014/097723
PCT Pub. Date: Jun. 26, 2014

(65) Prior Publication Data
US 2015/0330820 A1    Nov. 19, 2015

(30) Foreign Application Priority Data

Dec. 17, 2012   (JP) .................................. 2012-274204

(51) Int. Cl.
*G01P 15/08* (2006.01)
*G01F 1/684* (2006.01)
(Continued)

(52) U.S. Cl.
CPC ............ *G01F 1/684* (2013.01); *G01F 1/6842* (2013.01); *G01F 1/6845* (2013.01); *G01F 1/692* (2013.01);
(Continued)

(58) Field of Classification Search
CPC .......... G01F 1/68; G01F 1/684; G01F 1/6845; G01F 1/6842; H01L 21/311;
(Continued)

(56) References Cited

U.S. PATENT DOCUMENTS 5,719,069 A * 2/1998 Sparks ................ B81C 1/00246
148/DIG. 135
7,901,971 B2    3/2011  Hunziker et al.
(Continued)

FOREIGN PATENT DOCUMENTS

JP    2003-161721 A    6/2003
JP    2004-128399 A    4/2004
(Continued)

OTHER PUBLICATIONS

International Search Report (PCT/ISA/210) dated Dec. 3, 2013, with English translation (four (4) pages).

*Primary Examiner* — David Chen
(74) *Attorney, Agent, or Firm* — Crowell & Moring LLP (57) ABSTRACT

A thermal type sensor molded from a mold resin having an opening has a problem in that the residual stress of the mold resin in the opening causes peeling at the interface having poor adhesion. A physical quantity sensor has a construction having a semiconductor chip having a detector unit 3, a frame 8a on which the semiconductor chip is mounted, a mold resin portion 10 which encapsulates the semiconductor chip and the frame and has an opening through which the detector unit is exposed to the outside, and a stress absorbing layer 6 which is formed between an end of the opening in the mold resin portion and a wiring layer formed in the detector unit, and which is formed from a metal material that absorbs a stress from the end.

12 Claims, 9 Drawing Sheets

(51) Int. Cl.
*G01F 1/692* (2006.01)
*H01L 23/16* (2006.01)
*H01L 23/31* (2006.01)
*H01L 23/00* (2006.01)

(52) U.S. Cl.
CPC .......... *H01L 23/16* (2013.01); *H01L 23/3107* (2013.01); *H01L 23/562* (2013.01); *H01L 24/73* (2013.01); *H01L 2224/32245* (2013.01); *H01L 2224/48247* (2013.01); *H01L 2224/73265* (2013.01); *H01L 2924/1461* (2013.01); *H01L 2924/1815* (2013.01); *H01L 2924/3025* (2013.01)

(58) Field of Classification Search
CPC ... H01L 2924/1461; H01L 2224/48247; H01L 2924/181; G01L 9/0042; G01L 9/0054; B81C 1/00246; B81C 1/00158; B81B 2201/0292; B81B 2201/0264; B81B 2201/058; B81B 2203/0127; B81B 3/0072

USPC ..... 257/E21.249, 741, 417, 419; 438/54, 50, 438/51, 53

See application file for complete search history.

(56) References Cited

U.S. PATENT DOCUMENTS

| | | | |
|---|---|---|---|
| 7,906,859 | B2 | 3/2011 | Yoshioka et al. |
| 8,714,008 | B2 | 5/2014 | Sakuma |
| 2005/0269654 | A1* | 12/2005 | Tanaka .................. G01L 9/0054 257/415 |
| 2009/0020862 | A1* | 1/2009 | Chen ..................... B81B 7/0061 257/676 |
| 2012/0240674 | A1* | 9/2012 | Sakuma ................ G01F 1/6845 73/204.25 |

FOREIGN PATENT DOCUMENTS

| | | |
|---|---|---|
| JP | 2009-49298 A | 3/2009 |
| JP | 2010-50452 A | 3/2010 |
| JP | 2012-202786 A | 10/2012 |

* cited by examiner

PHYSICAL QUANTITY SENSOR

TECHNICAL FIELD

The present invention relates to a physical quantity sensor, more particularly to a physical quantity sensor which is encapsulated by a mold resin and has an opening in the mold resin.

BACKGROUND ART

Currently, with respect to a fluid flow sensor used in an air flow meter which is provided in an electronic controlled fuel injection apparatus for an internal combustion engine of an automobile or the like to measure an intake air amount, those of a thermal type can directly detect a mass air flow and are being mainly used.

Of these, especially a thermal type air flow sensor element produced by an MEMS (Micro Electro Mechanical Systems) technique using a semiconductor can reduce the cost and can be driven by a low electric power, and hence has attracted attention.

In such a sensor using an MEMS, the sensor assembled on an expensive metal or a ceramic substrate is subjected to resin encapsulation to achieve cost reduction and miniaturization. In this connection, resin encapsulation has been proposed in which a mold resin having an opening formed only at a position for a sensor element portion for measurement is used and a portion of the sensor except the sensor element portion is encapsulated by the mold resin.

As an example of a conventional resin encapsulation technique having an opening in a part of the resin, PTL 1 has a description of a technique in which a mold having a protruding portion and a lead frame having fitted thereto a semiconductor element are meshed to form a depressed groove portion between a detector unit and an electrode unit of the semiconductor element. In PTL 1, a mold resin is introduced into the depressed groove portion to obtain an anchoring effect, so that the bond strength of the mold resin to the surface of the semiconductor element is improved, preventing the occurrence of peeling or the formation of cracks in the mold resin layer around the opening.

Further, PTL 2 has a description of a technique in which a buffer layer is formed in a region in contact with a housing present in the outer periphery of an opening. The buffer layer has a function of preventing the mold for forming an opening from breaking the detector unit, and a function as a stress relaxation layer between an integrated circuit and a semiconductor electronic element. The buffer layer is formed from a resin material, such as an epoxy resin, or an organic material, such as a silicone rubber.

CITATION LIST

Patent Literature

PTL 1: JP-A-2009-49298
PTL 2: JP-A-2010-50452

SUMMARY OF INVENTION

Technical Problem

Both the techniques described in PTLs 1 and 2 have a problem in that the residual stress of the mold resin in the opening causes peeling at the interface having poor adhesion. The details of this are described with reference to FIGS. 10 and 11.

Figure 10:
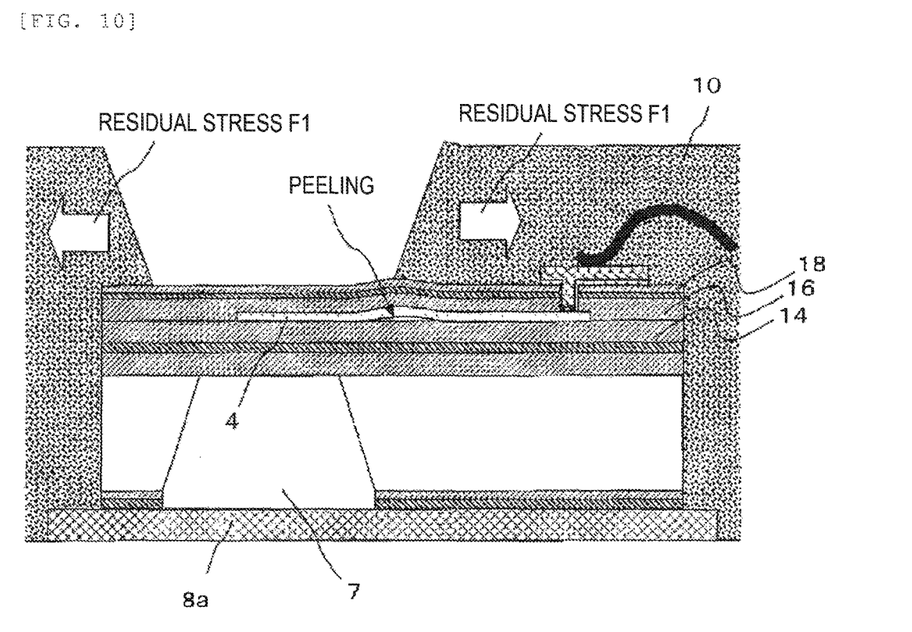
FIG. 10 is a cross-sectional view showing the influence of a stress caused by the mold resin.

FIG. 10 is a view explaining the residual stress of a mold resin in the case where the mold resin is molded directly on an insulating film on a wiring 4. The influence of the residual stress in the case where a depressed groove portion is formed as described in PTL 1 can be considered to be similar to that in FIG. 10. As shown in FIG. 10, in the mold resin which has been charged at about 200° C. during molding, when the temperature is lowered to room temperature, a residual stress F1 is caused such that the whole of the resin undergoes shrinkage. In general molding free of an opening, the residual stress of a mold resin 10 is uniformly dispersed and hence causes no problem. However, in the molding for a resin having an opening, a residual stress such that the resin undergoes shrinkage is disadvantageously concentrated in an end of the opening in the mold resin. In this case, the mold resin 10 is a material having a high adhesive force with an insulating film 18 with which a thermal type fluid flow sensor 1 is in contact (further in PTL 1, the adhesive force is further improved by the depressed groove portion), and therefore the stress is likely to be concentrated in the interface between the wiring 4 and an insulating film 16 disposed thereon or the interface between the wiring 4 and an insulating film 14 disposed thereunder, which is the interface having poor adhesive force and being positioned below the opening. Particularly, when a durability test, such as a temperature cycle test, is performed, the residual stress F1 is enhanced to cause peeling at the above-mentioned interface, and thus the wiring 4 is changed in the resistance value, so that the accuracy of detection becomes poor. Further, when this state is left as such, the peeling further progresses, and cracks are caused in the insulating film on the peeled wiring 4, so that the wiring 4 is brought into contact with the outside air to suffer corrosion, causing a trouble of wire breakage.

Figure 11:
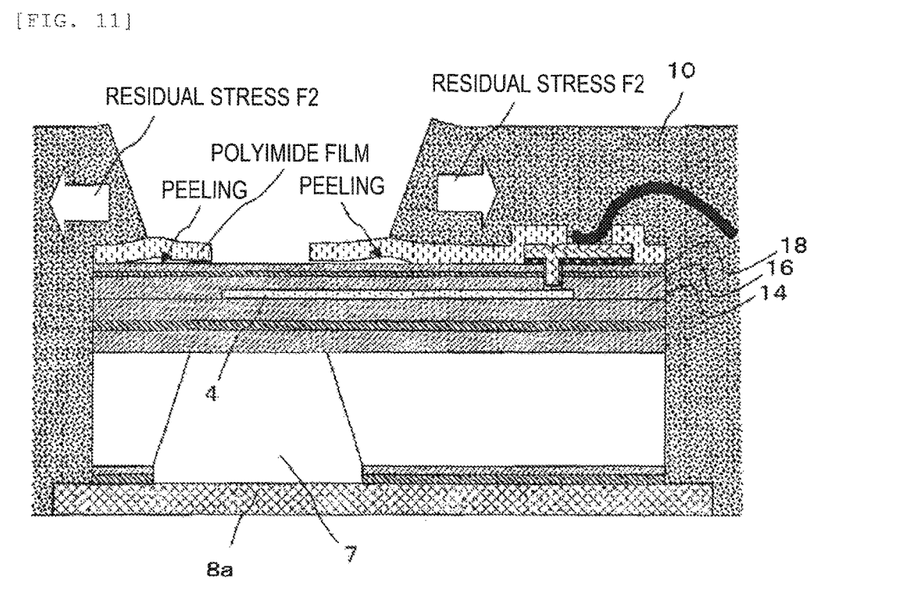
FIG. 11 is a cross-sectional view showing the influence of a stress caused by the mold resin.

FIG. 11 is a view explaining the residual stress of the mold resin in the case where, as described in PTL 2, a polyimide film is formed on an insulating film 18 so as to form a structure in which the end of a mold resin 10 is not directly in contact with the insulating film 18. In this case, the residual stress of the mold resin 10 is concentrated in the end of the opening like that in FIG. 10, but the polyimide film has a low Young's modulus such that it can relax the residual stress F2 to some extent. The relaxed residual stress F2, however, remains in the interface with the polyimide film and inside of the film, and, when a durability test is performed, the stress is concentrated in the interface between the polyimide film and the underlying insulating film 18 or the mold resin 10, causing peeling at the interface. When the peeling caused between the polyimide film and the underlying insulating film 18 progresses, moisture or the like penetrates the interface to cause a pad portion 5 to suffer corrosion, so that a trouble of wire breakage occurs. In the case where an epoxy resin having excellent adhesion with the underlying insulating film 18 is used instead of the polyimide film 28, the surface of the epoxy resin or the like has water repellancy, and hence the adhesion with the resin, which is a material for the mold resin, and the like is poor, and thus there is similarly a concern about the peeling as seen in FIG. 11.

Accordingly, an object of the present invention is to provide a physical quantity sensor which is markedly reduced in the influence of the residual stress after molding so that the sensor has high sensitivity and high reliability.

Solution to Problem

As a representative example of the means for solving the problems in the invention, there can be mentioned a physical quantity sensor, which is characterized by having: a semiconductor chip having a detector unit, a frame on which the semiconductor chip is mounted, a mold resin portion which encapsulates the semiconductor chip and the frame and has an opening through which the detector unit is exposed to the outside, and a stress absorbing layer being formed between an end of the opening in the mold resin portion and a wiring layer formed in the detector unit, and containing a metal material which absorbs a stress from the end.

Advantageous Effects of Invention

In the invention, there can be provided a physical quantity sensor having higher sensitivity and high reliability.

DESCRIPTION OF EMBODIMENTS

Hereinbelow, Examples of the present invention will be described with reference to the drawings. In the following Examples, as an example of the physical quantity sensor, particularly, a thermal type fluid flow sensor is described, but the invention can be similarly applied to other sensors encapsulated by a mold resin having an opening, for example, a humidity sensor and a pressure sensor.

Further, in the following Examples, the "upper" means the direction which is perpendicular to the surface of the semiconductor substrate, and in which the detector unit and the pad are formed (the direction in which an insulating film and the like are stacked).

Example 1

Construction of a Thermal Type Fluid Flow Sensor

Figure 1:
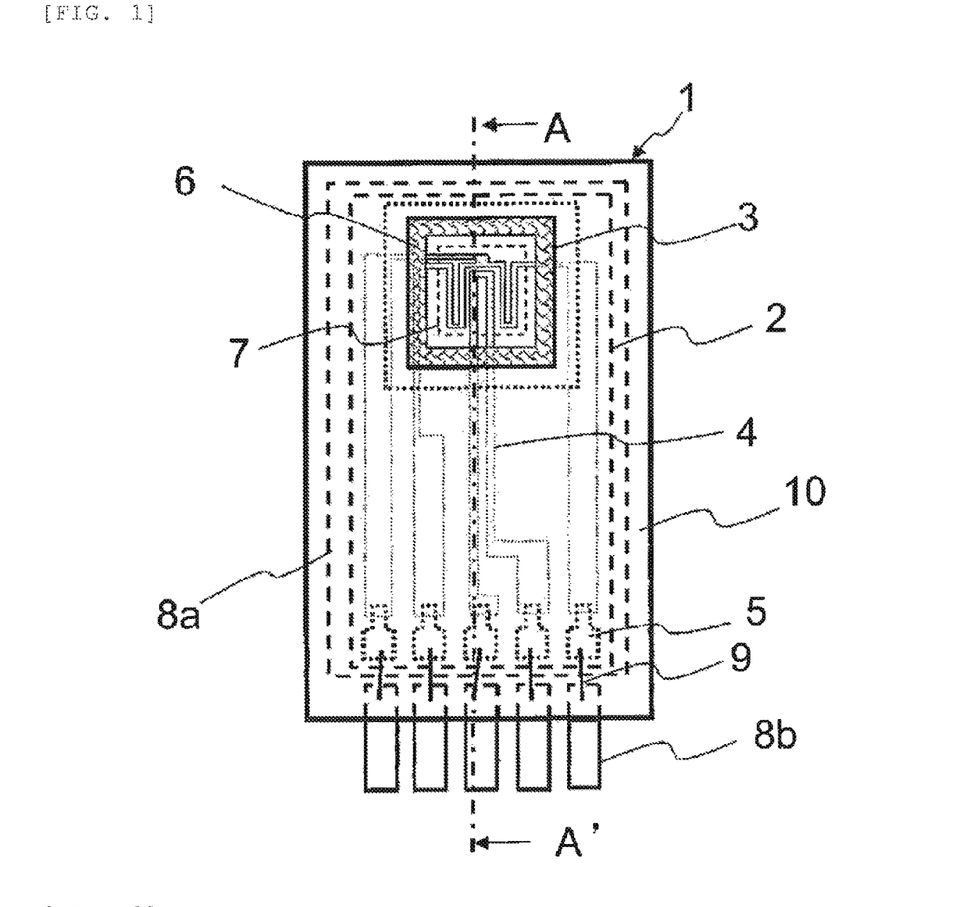
FIG. 1 is a detailed portion plan view showing an example of the thermal type fluid flow sensor in Example 1 of the invention.
Figure 2:
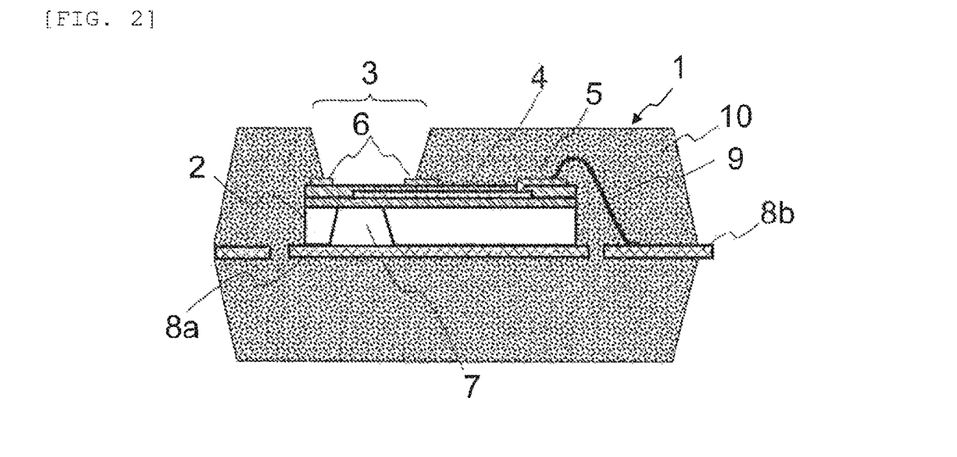
FIG. 2 is a detailed portion cross-sectional view of the thermal type fluid flow sensor in Example 1 of the invention.

An example of a detailed portion plan view of the thermal type fluid flow sensor 1 in Example 1 is shown in FIG. 1, and a detailed portion cross-sectional view taken along the line A-A' in FIG. 1 is shown in FIG. 2.

As shown in FIGS. 1 and 2, in a sensor element 2 mounted on a lead frame 8a, an air flow metering unit 3 for detecting a flow rate of a fluid, a wiring 4 for a heater, a sensor, and the like, and an electrode 5 for input and output toward the outside are formed. The air flow metering unit 3 is provided with a diaphragm structure 7 having removed the back surface of a semiconductor substrate. Further, the electrode 5 and an external terminal 8b of the lead frame are connected to each other through a wire bonding 9. The wiring 4 is supplied with a power source from the outside through the electrode 5 and external terminal 8a to output a heater temperature and a sensor signal to the outside. The sensor element 2 is covered with a mold resin 10, except for a portion of the air flow metering unit 3, and a stress absorbing layer 6 is formed through an insulating film between the end of the mold resin 10 and the wiring 4 of the air flow metering unit 3. The planer form of the diaphragm structure 7 shown in FIG. 1 is a square form, but the planer form of the diaphragm structure is not particularly limited, and may be another form, for example, a rectangular form having long sides in the lateral direction as viewed in FIG. 1.

<Method for Producing the Thermal Type Fluid Flow Sensor>

Next, an example of the method for producing the thermal type fluid flow sensor in Example 1 is described with reference to FIGS. 3 to 6 in the order of the steps. FIGS. 3 to 6 are detailed portion cross-sectional views taken along the line A-A' in FIG. 1.

Figure 3:
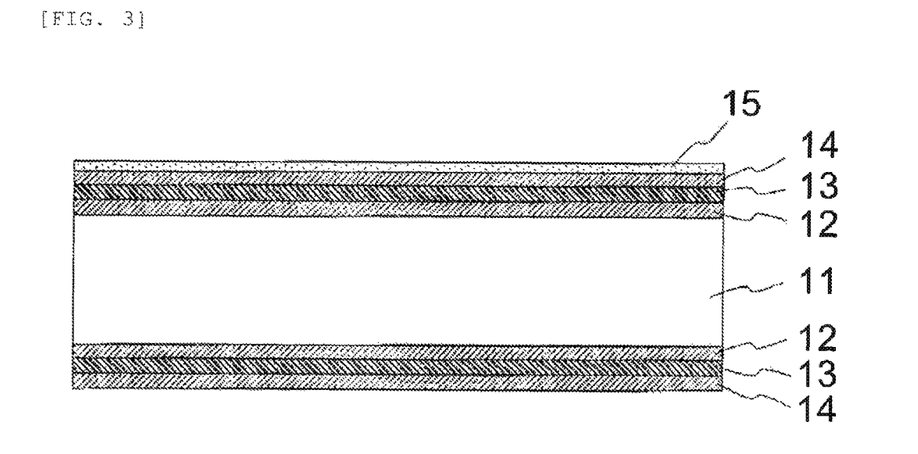
FIG. 3 is a detailed portion cross-sectional view showing a production process for a semiconductor substrate of the sensor element in Example 1 of the invention.

First, as shown in FIG. 3, a semiconductor substrate 11 formed from single crystal Si is provided. Subsequently, an insulating film 12 is formed on the principal surface of the semiconductor substrate 11, and further an insulating film 13 and an insulating film 14 are successively formed. The insulating film 12 is a silicon oxide film formed in, for example, a furnace at a high temperature, and has a thickness of about 200 nm. The insulating film 13 is a silicon nitride film formed using, for example, a CVD method, and has a thickness of about 100 to 200 nm. The insulating film 14 is a silicon oxide film formed using, for example, a CVD method, and has a thickness of about 300 to 500 nm. The insulating films 12, 13, 14 are also formed on the back surface of the semiconductor substrate 11.

The insulating film 12 and insulating film 14 are individually a film (second insulating film) having a compressive stress, and the insulating film 13 is a film (first insulating film) having a tensile stress. The residual stress of the first insulating film is a tensile stress of, for example, about 700 to 1,200 MPa, and the residual stress of the second insulating film is a compressive stress of, for example, about 50 to 250 MPa. Further, an insulating film 17 may be an aluminum nitride film having a tensile stress of 500 to 1,200 MPa. After these insulating films are formed, for regulating the stresses of the films, the films may be subjected to heat treatment in a nitrogen atmosphere at about 1,000° C. Further, on the resultant films, an insulating film having a tensile stress and an insulating film having a compressive stress may be further formed repeatedly and stacked on one another.

Next, as a metal film 15, a Mo (molybdenum) film is formed by, for example, a sputtering method so as to have a thickness of about 100 to 200 nm. In this instance, for improving the adhesion and improving the crystalline properties, before depositing a Mo film, the underlying insulating film 14 is etched by about 5 to 20 nm by a sputter etching method using Ar (argon) gas, and a Mo film is formed under conditions such that the temperature of the semiconductor substrate 11 upon depositing the Mo film is about 200 to 500° C. For further improving the crystalline properties of the Mo film, the formed Mo film is subjected to heat treatment in a nitrogen atmosphere at about 1,000° C. in a furnace or a lamp heating apparatus.

Figure 4:
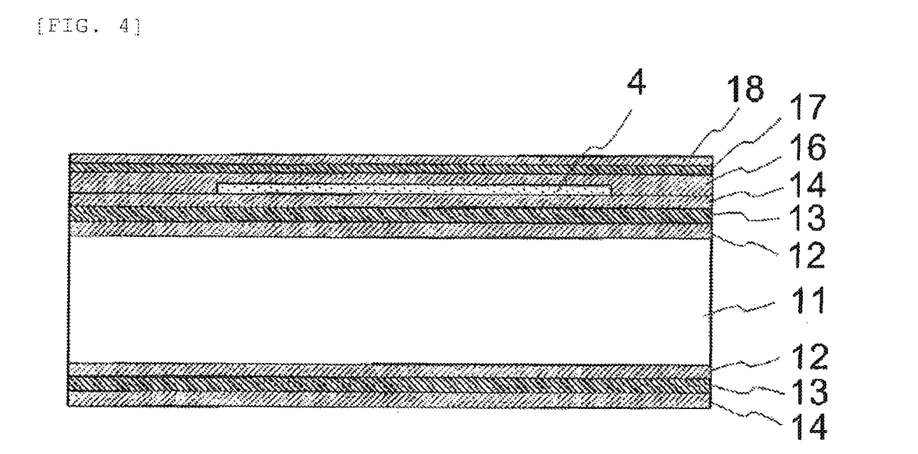
FIG. 4 is a detailed portion cross-sectional view showing a production process for a semiconductor substrate of the sensor element in Example 1 of the invention.
Figure 5:
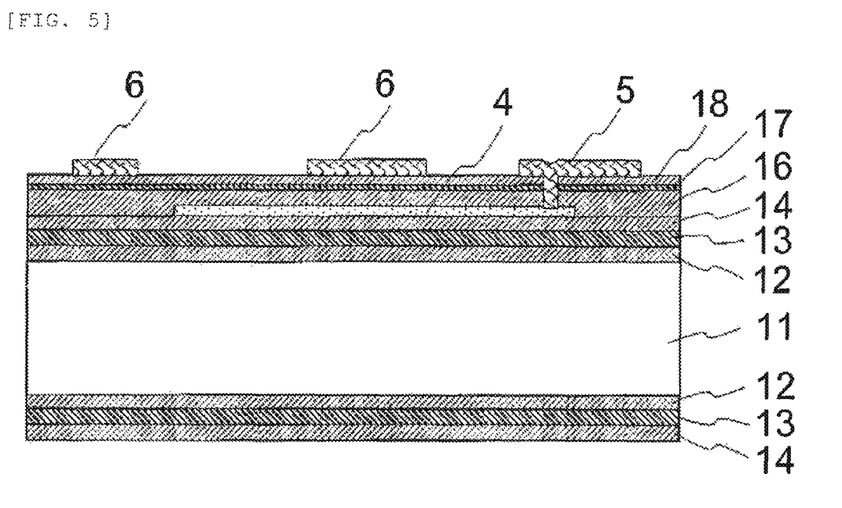
FIG. 5 is a detailed portion cross-sectional view showing a production process for a semiconductor substrate of the sensor element in Example 1 of the invention.

Then, as shown in FIG. 4, the metal film 15 is subjected to patterning by etching using a photolithography method to form a heating resistance element forming the air flow metering unit 3, a temperature-sensing resistance element for heating resistance element, a temperature-sensing resistance element, an air temperature-sensing resistance element disposed in the mold resin, a resistance element for heater temperature control, and a lead wiring 4. Then, as an insulating film 16 for protecting the wiring, for example, by a CVD method or a low temperature CVD method using plasma and using TEOS (tetraethoxysilane) as a raw material, a silicon oxide film is formed so as to have a thickness of about 300 to 600 nm, and an insulating film 17 and an insulating film 18 are successively formed. The insulating film 17 is a silicon nitride film deposited by, for example, a CVD method or a low temperature CVD method using plasma, and has a thickness of about 150 to 200 nm. The insulating film 18 is a silicon oxide film deposited by, for example, a CVD method or a low temperature CVD method using plasma and using TEOS as a raw material, and has a thickness of about 100 to 500 nm. For regulating the stress and improving the moisture resistance, the insulating films 16, 17, 18 may be subjected to heat treatment at about 1,000° C. After the insulating film 16 is formed, CMP (Chemical Mechanical Polishing) may be performed to adjust the thickness of the insulating film in the heater portion and sensor portion of the detector unit.

Next, a contact hole for exposing a part of the wiring 4 is formed by dry etching or wet etching using a photolithography method. Then, as a metal film, for example, an Al alloy film having a thickness of about 1 µm is formed so as to fill the contract hole. For achieving excellent contact of the metal film, before forming the metal film, the surface of the wiring 4 in the contact hole may be subjected to sputter etching using Ar (argon) gas. For further surely achieving the excellent contact, before depositing the Al alloy film, as a third metal film, a barrier metal film, such as a TiN (titanium nitride) film, may be deposited to form a stacked film of the barrier metal film and the Al alloy film. As an example of the barrier metal film, a TiN film is mentioned, but a TiW (titanium tungsten) film, a Ti (titanium) film, or a stacked film of these films may be used. Then, the metal film is subjected to patterning by dry etching or wet etching using a photolithography method to form a pad portion 5 electrically connected to the wiring 4 through the contact hole, and a stress absorbing layer 6 provided below the region in which an end of an opening of the mold resin is formed later, obtaining a structure shown in FIG. 5.

Figure 6:
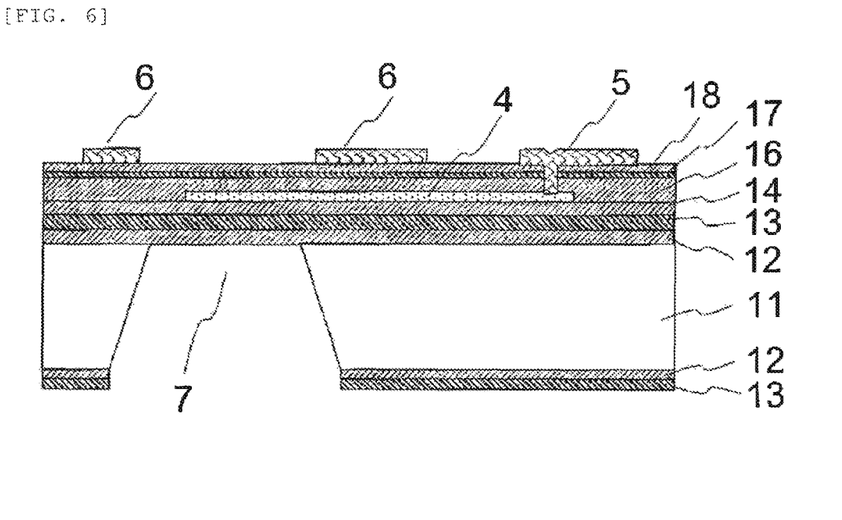
FIG. 6 is a detailed portion cross-sectional view showing a production process for a semiconductor substrate of the sensor element in Example 1 of the invention.

Then, as shown in FIG. 6, a pattern of a photoresist film (not shown) is formed on the back surface of the semiconductor substrate 11 by a photolithography method, and the insulating films 12, 13 and insulating film 14 formed on the back surface are removed by a dry etching method or a wet etching method. Then, using the remaining insulating films 12, 13, 14 as a mask, the back surface of the semiconductor substrate 11 subjected to wet etching using an aqueous solution of or containing as a main component KOH (potassium hydroxide) or TMAH (Tetramethylammonium hydroxide) to form a diaphragm structure 7.

In the above embodiment, the thermal type fluid flow sensor in which the metal film 15 constituting the wiring 4 for a heating resistance element and the like is formed from Mo is described, but the metal film may be formed from a metal other than Mo, a metal nitride compound, a metal silicide compound, polycrystalline silicon, or polycrystalline silicon doped with phosphorus or boron as an impurity. Examples of the metals include metals containing as a main component α-Ta (alpha-tantalum), Ti (titanium), N (tungsten), Co (cobalt), Ni (nickel), Fe (iron), Pb (niobium), Hf (hafnium), Cr (chromium), Zr (zirconium), or the like. Examples of the metal nitride compounds include TaN (tantalum nitride), MoN (molybdenum nitride), and WN (tungsten nitride). Examples of the metal silicide compounds include MoSi (molybdenum silicide), CoSi (cobalt silicide), and NiSi (nickel silicide). Further examples include polysilicon doped with phosphorus or boron.

On the other hand, the material for the pad portion 5 and stress absorbing layer 6 is Al in the above embodiment, but the material may be a metal material having a Young's modulus lower than that of the metal film 15 constituting the wiring 4. Specific examples of metal materials include any one of elements included in a metal group consisting of Al (aluminum), Cu (copper), Au (gold), Ni (nickel), Pt (platinum), and Ag (silver), an alloy containing any one of elements included in the metal group, and a compound of any one of elements included in the metal group and Si (silicon). Further, as mentioned above, the stress absorbing layer 6 may have a stacked structure having a metal film formed from the above metal material and at least one of a TiN (titanium nitride) film, a TiW (titanium tungsten) film, and a Ti (titanium) film.

<Construction of a Thermal Type Fluid Flow Meter>

Figure 7:
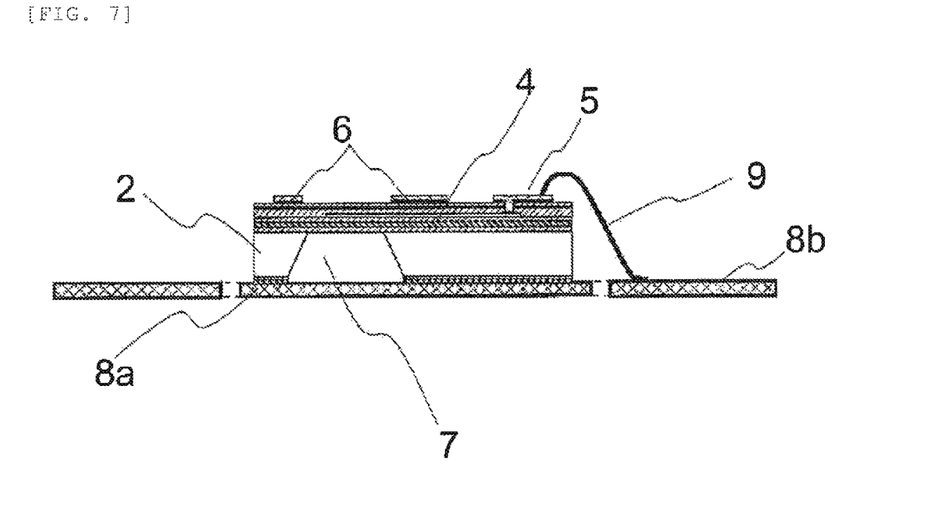
FIG. 7 is a detailed portion cross-sectional view showing a production process for the thermal type fluid flow sensor in Example 1 of the invention.

FIG. 7 shows the state of the thermal type fluid flow sensor in Example 1, which is mounted on a lead frame 8. A sensor element 2 is fixed onto a lead frame 8a using a silver paste, a resin adhesive seal, or the like, and then a lead frame 8b which serves as an external terminal is connected to a desired pad 5 by a wire bonding 9.

Figure 8:
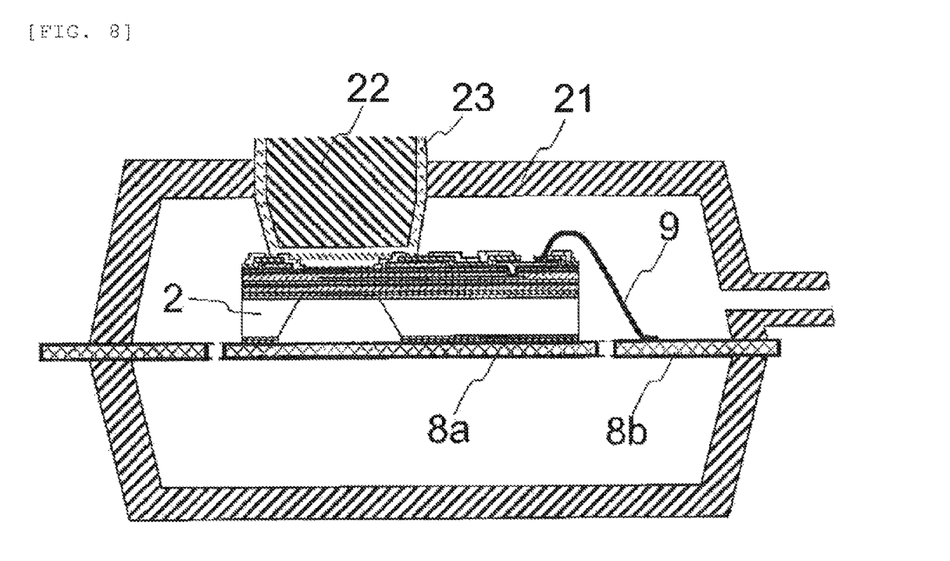
FIG. 8 is a detailed portion cross-sectional view showing a production process for the thermal type fluid flow sensor in Example 1 of the invention.

Then, as shown in FIG. 8, the sensor element 2 disposed on the lead frame 8a shown in FIG. 7 is fitted to a mold 21 for molding, and then an insert piece 22 for forming an opening is pressed through a shield film 23 for protecting the air flow metering unit 3, followed by injection of a mold resin. Subsequently, an unnecessary lead frame is cut to form a molded thermal type flow sensor having an opening shown in FIG. 2.

Figure 9:
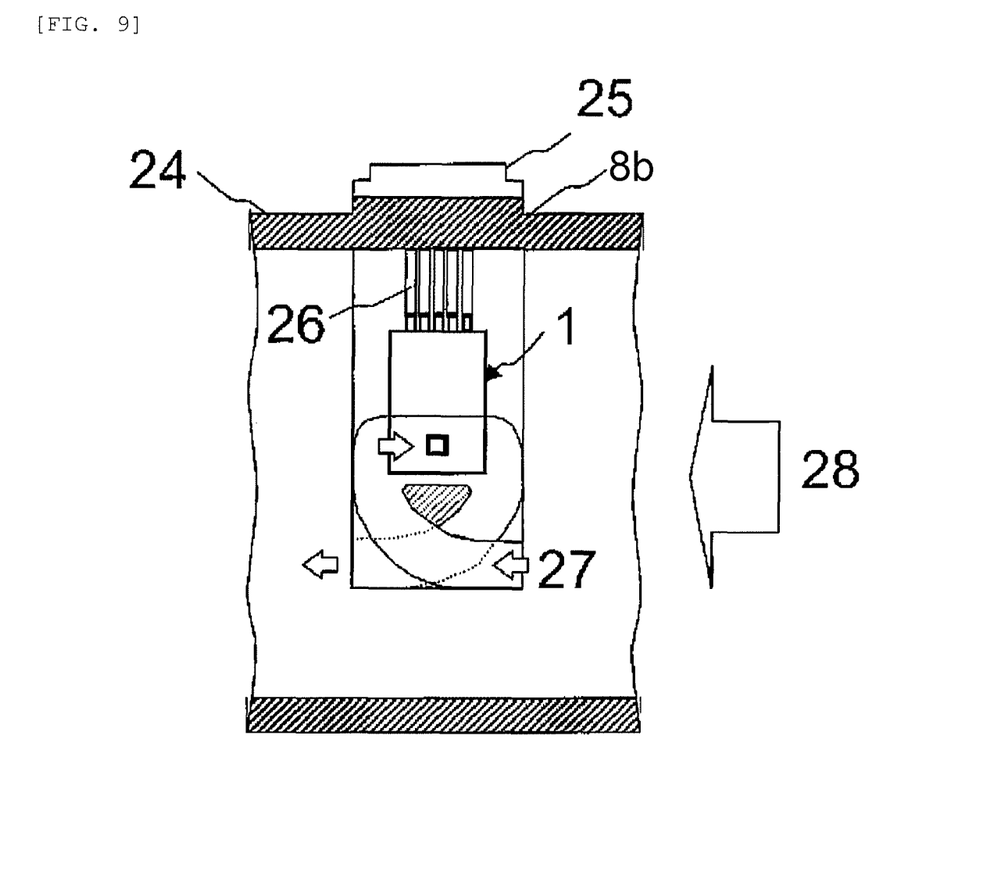
FIG. 9 is a schematic layout view of a thermal type air flow meter having mounted thereon the thermal type fluid flow sensor which is fitted to an intake passage in an internal combustion engine of an automobile or the like in the embodiment 1 of the invention.

FIG. 9 is a schematic layout view of a thermal type air flow meter 25 fitted to an intake passage 24 in an internal combustion engine of an automobile or the like. The air flow meter 25 has provided outside the intake passage a connector for connecting a power source and an electric signal of an ECU (Engine Control Unit) for controlling an automobile, and is connected to an external terminal 8b of a thermal type fluid flow sensor 1 through an internal wiring 26 of the air flow meter. Further, a sub-passage 27 is provided in the thermal type air flow meter 25 so that air flows in the direction indicated by arrows. The flow metering unit 3 of the thermal type fluid flow sensor 1 is disposed in the place of the sub-passage 27 where air passes. The air supplied flows in the direction of an air flow 28 indicated by an arrow or in the opposite direction according to the conditions of the internal combustion engine, and it is possible to detect an air flow in any state. Further, actually, a cover is put over the internal wiring 26, external terminal 8b, and sub-passage 27 of the thermal type fluid flow sensor 1.

<Characteristic Feature of Example 1 and Effects Thereof>

Thus, the physical quantity sensor in Example 1 is characterized by having: a semiconductor chip having a detector unit 3, a frame 8a on which the semiconductor chip is mounted, a mold resin portion 10 which encapsulates the semiconductor chip and the frame and has arm opening through which the detector unit is exposed to the outside, and a stress absorbing layer 6 being formed between an end of the opening in the mold resin portion and a wiring layer 4 formed in the detector unit, and containing a metal material which absorbs a stress from the end. Hereinbelow, the effects of the invention in Example 1 are described with reference to FIG. 12.

Figure 12:
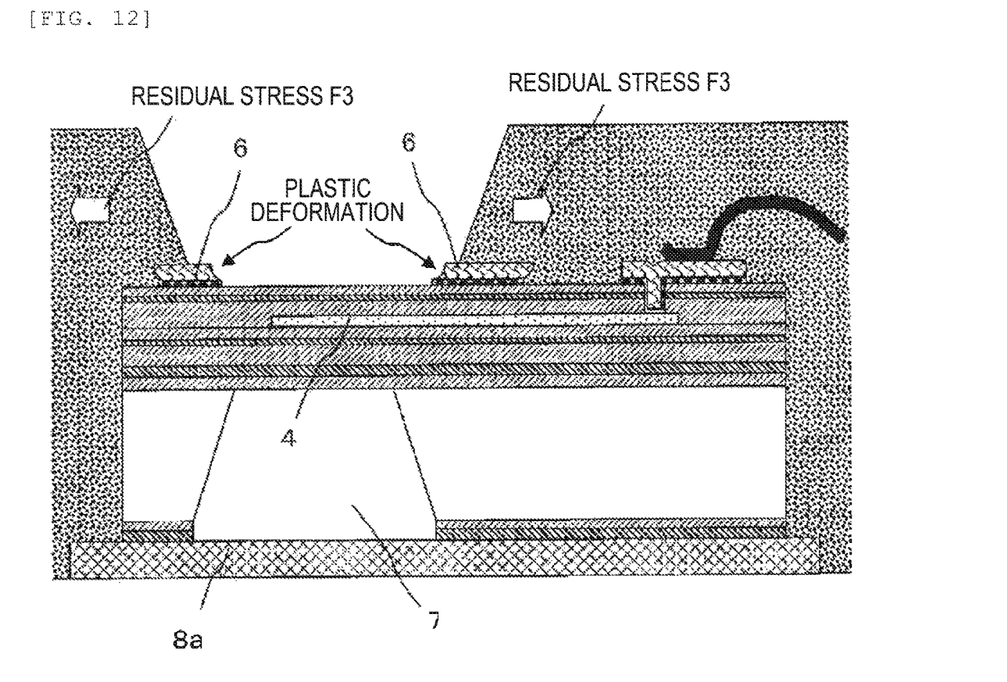
FIG. 12 is a cross-sectional view showing the influence of a stress caused by the mold resin.

The stress absorbing layer 6 is likely to suffer plastic deformation, and slides according to the shrinkage of the mold resin 10 after being molded, markedly reducing the influence of the residual stress of the mold resin 10 on other films, for example, the insulating film 19 and the underlying wiring. Particularly, for surely reducing the influence on the air flow metering unit 3, it is desired that, in the plane parallel to the substrate surface of the semiconductor chip, the stress absorbing layer 6 is formed outside the outer periphery of the diaphragm 7.

Further, the Al film has excellent compatibility with both the underlying insulating film 18 and the mold resin 10, and further has a Young's modulus lower than that of the metal film 15 constituting the wiring 4, namely, is a flexible film, and therefore the film is unlikely to cause separation and peeling. From the above, a comparison of the residual stresses of FIGS. 10 to 12 can be represented as follows.

$$F1 \approx F2 > F3$$

Therefore, the influence of the residual stress on the end of the opening in the mold resin is remarkably reduced, as compared to that in a conventional technique, and stable properties can be maintained even when a durability test is performed.

The stress absorbing layer 6 is connected to a semiconductor substrate 11, and the semiconductor substrate 11 is connected to a ground so that the stress absorbing layer has a ground potential, and thus charges of the portion exposed through the opening are allowed to go to the outside, making it possible to stabilize the properties of the thermal type sensor. Alternatively, the stress absorbing layer 6 may be disposed so that a pad of the ground electrode and the stress absorbing layer 6 are connected to each other. It is noted that the stress absorbing layer 6 faces the opening and hence is likely to suffer corrosion, and therefore, in this case, it is necessary that the wiring width be reduced and the distance between the wiring and the pad be increased by taking a circuit round or the like. Further, when the stress absorbing layer 6 is grounded, an effect of dust collection is also obtained.

Example 2

The position in which the stress regulation layer 6 is formed is not limited to one in the case where the stress regulation layer is directly in contact with the mold resin 10. In Example 2, a construction is described in which a cover layer is formed between the stress regulation layer 6 and the mold resin 10 for preventing moisture from arriving at the pad portion 5 through the mold resin 10 to cause corrosion.

Figure 13:
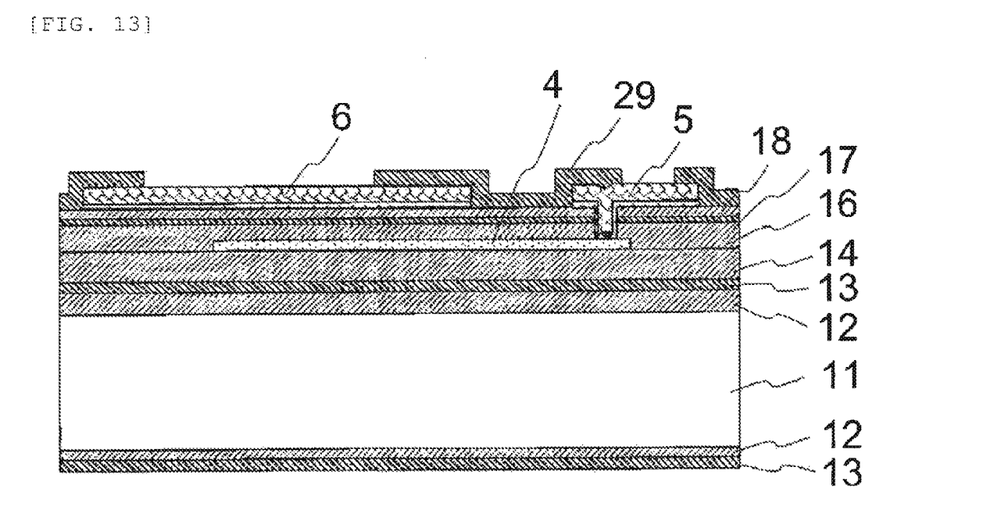
FIG. 13 is a detailed portion cross-sectional view showing a production process for a semiconductor substrate of the sensor element in Example 2 of the invention.
Figure 14:
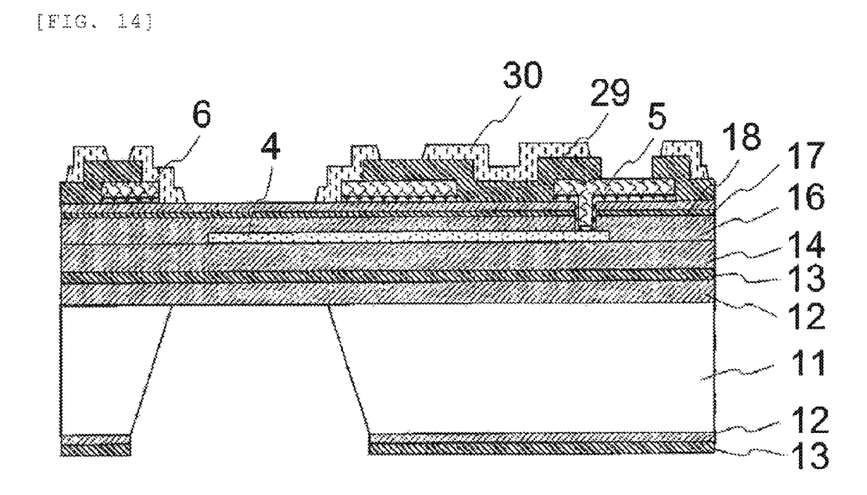
FIG. 14 is a detailed portion cross-sectional view showing a production process for a semiconductor substrate of the sensor element in Example 2 of the invention.

FIGS. 13 and 14 are detailed portion cross-sectional views showing the steps for forming the thermal type fluid flow sensor in Example 2. The steps in FIGS. 3 and 4 and the previous steps are the same as those in Example 1, and hence the subsequent steps are described below.

After the step of FIG. 4, as shown in FIG. 13, a contact hole for exposing a part of the wiring 4 is formed by dry etching or wet etching using a photolithography method. Then, as a metal film, for example, an Al alloy film having a thickness of about 1 μm is formed so as to fill the contact hole. For achieving excellent contact of the metal film, before forming the metal film, the surface of the wiring 4 in the contact hole may be subjected to sputter etching using Ar (argon) gas. For further surely achieving the excellent contact, before depositing the Al alloy film, as a third metal film, a barrier metal film, such as a TiN (titanium nitride) film, may be deposited to form a stacked film of the barrier film and the Al alloy film. As an example of the barrier metal film, a TiN film is mentioned, but a TiW (titanium tungsten) film, a Ti (titanium) film, or a stacked film of these films may be used, and this step and the previous steps are the same as those in the Example.

Then, the metal film is subjected to patterning by dry etching or wet etching using a photolithography method to form a pad portion 5 and a stress absorbing layer 6. In this instance, in Example 2, the patterning is conducted so that the stress absorbing layer 6 including the region forming the diaphragm 7 remains. A cover layer 29 is then formed. The cover layer 29 may be an insulating film formed at least between the mold resin 10 and the stress absorbing layer 6, and is a silicon nitride film deposited by, for example, a CVD method or a low temperature CVD method using plasma, and has a thickness of about 1,000 to 2,000 nm. The cover layer 29 may be a stacked film of a silicon oxide film deposited by a low temperature CVD method using plasma and using low temperature TEOS as a raw material and the above-mentioned silicon nitride film, or may be an aluminum nitride film, a silicon carbide film, or a stacked film of the above film, a silicon oxide film, and a silicon nitride film. By forming the cover layer 29, not only can the stress absorbing layer 6 be prevented from suffering corrosion, but also the adhesion of the mold resin 10 and the stress absorbing layer 6 can be further improved. Further, when a part of the stress absorbing layer 6 is removed as described below with reference to FIG. 14, a region which is not covered with the cover layer 29 is caused in the stress absorbing layer 6, but this region is covered with an insulating film 30 and hence arises no problem, and the cover layer 29 may cover at least part of the stress absorbing layer 6.

Next, the insulating film 29 is processed by dry etching or wet etching using a photolithography method using the underlying stress absorbing layer 6 and pad portion 5 as an etch stop layer.

Then, as shown in FIG. 14, the region of the stress absorbing layer 6 larger than the diaphragm 7 is removed by dry etching or wet etching using a photolithography method. The reason for this step is as follows. When the above region is left as such, the high thermal conductivity of the Al film makes it impossible to cause temperature gradient in the sensor wiring during heating of the diaphragm 7 by a heater. This step is conducted, so that the stress absorbing layer is formed, in the plane parallel to the surface of the substrate, at least outside the outer periphery of the surface of the diaphragm.

Next, as a protective film 30, an insulating film, for example, a polyimide film is applied, and then a portion of the applied protective film 30 positioned above the pad portion 5, the end of the mold resin 10, and, if necessary, the diaphragm 7 is removed by dry etching or wet etching using a photolithography method. Finally, the back surface of the Si substrate is subjected to wet etching using a liquid containing KOH or TMAH using a photolithography method to form a diaphragm 7. The protective film 30 has a role of covering the portion of the stress absorbing layer 6, which is not covered with the cover layer 29, and which is caused by removing a part of the stress absorbing layer 6, to further improve the effect of preventing corrosion of the stress absorbing layer 6.

In this case, the place where the end of the mold resin 10 is positioned may be either the Al film 6 or the protective film 30. The reason for this is that the residual stress of the mold resin 10 is applied to the stress absorbing layer 6 through the protective film 30 and cover layer 29, so that the stress absorbing layer 6 slides as in Example 1 to markedly reduce the influence of the stress on the underlying wiring 4.

It is desired that, in the plane parallel to the surface of the substrate, the protective film 30 is positioned inside the end of the opening in the mold resin 10. The reason why the protective film 30 is formed in such a position is that an effect can be obtained such that the resin is prevented from flowing when en opening is formed in the mold resin 10.

Figure 15:
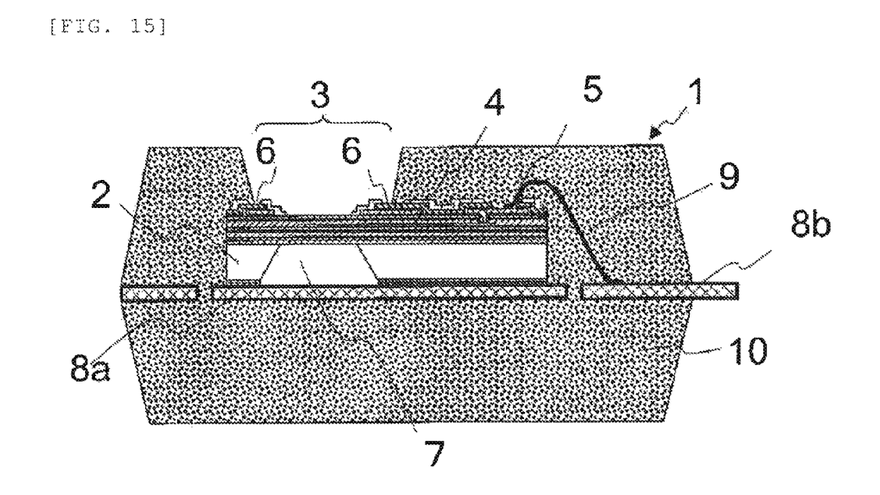
FIG. 15 is a detailed portion cross-sectional view of the thermal type fluid flow sensor in Example 2 of the invention.

FIG. 15 shows a thermal type fluid flow sensor 1 having molded the sensor element 2 shown in FIG. 14. As shown in this figure, a structure is formed in which the stress absorbing layer 6 is disposed under the end of the mold resin 10 of the air flow metering unit 3, and the wiring 4 for a heater and a sensor is disposed under the stress absorbing layer.

Example 3

Figure 16:
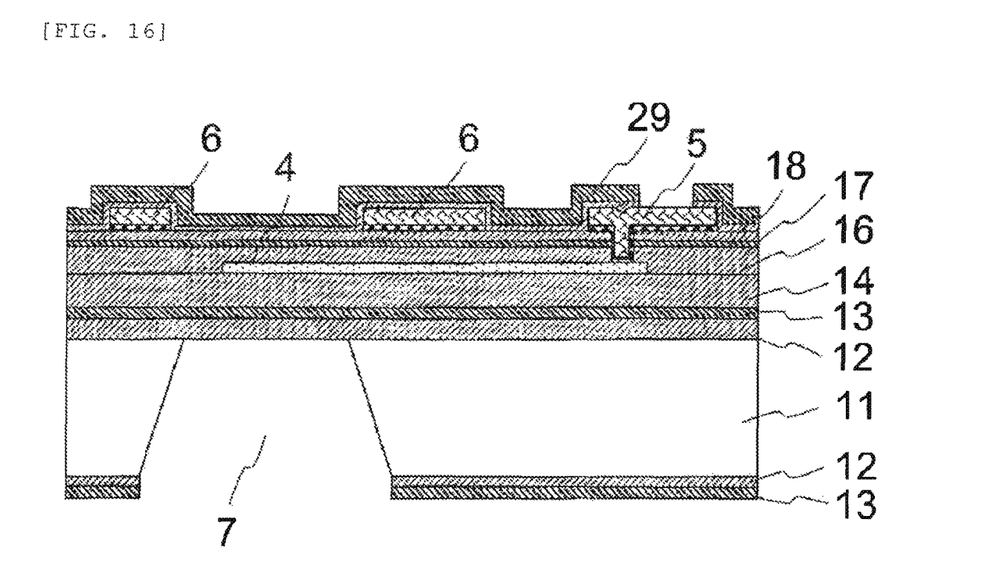
FIG. 16 is a detailed portion cross-sectional view showing the sensor element in Example 3 of the invention.

FIG. 16 shows a structure in which the whole surface except the pad portion 5 is covered with the cover layer 29, wherein the step of removing the cover layer 29 positioned at the diaphragm 7 portion in Example 2 is omitted for reducing the cost. In this Example 3, it is necessary to regulate the stress of the silicon nitride film as the cover layer 29 so as to regulate the film stress of the whole of the diaphragm 7. In other words, it is desired that the insulating film 29 has a tensile stress of 200 MPa or more so that film deformation is very slight even when the heater of the diaphragm 7 is heated. For achieving this, the thickness of the insulating film 29 may be, for example, 1,000 nm or more. Also in this case, the residual stress of the layer under the end of the mold resin 10 is applied to the stress absorbing layer 6 through the protective film 30 and cover layer 29, so that the stress absorbing layer 6 slides to markedly reduce the influence of the stress on the underlying wiring 4 for a heater and a sensor, obtaining the effect similar to that of Example 1. In the effect of the present invention, the stress absorbing layer 6 may be disposed at least on the wiring 4 at the end of the mold resin 10 as viewed from the upper side. Further, the stress absorbing layer 6 in Example 3 is unlikely to be affected by corrosion, and therefore may be used in a wiring the resistance change of which does not affect the accuracy, such as a around lead.

REFERENCE SIGNS LIST

1: Physical quantity sensor
2: Sensor element
3: Air flow metering unit
4: Wiring
5: Pad portion
6: Stress absorbing layer
7: Diaphragm
8a; 8b: Lead frame
9: Wire bonding
10: Mold resin
11: Semiconductor substrate
12; 14; 16; 18: Silicon oxide film
13; 17: Silicon nitride film
15: Metal film
19: Contact hole
21: Mold
22: Insert piece
23: Shield film
24: Intake passage
25: Air flow meter
26: Internal wiring
27: Sub-passage
28: Flow of air
29: Cover layer
30: Protective film

The invention claimed is:
1. A physical quantity sensor, characterized by having:
a semiconductor chip having a detector unit,
a frame on which the semiconductor chip is mounted,
a mold resin portion which encapsulates the semiconductor chip and the frame and has an opening through which the detector unit is exposed to outside of the physical quantity sensor, and
a stress absorbing layer being formed between ends of the opening in the mold resin portion and above a wiring layer formed in the detector unit, and the stress absorbing layer contains a metal material which absorbs a stress from the ends of the opening,
wherein a first portion of the stress absorbing layer protrudes beyond a first edge of the opening to be exposed from the mold resin portion and inside of an edge of the semiconductor chip, and a second portion of the stress absorbing layer protrudes beyond a second edge of the opening to be exposed from the mold resin portion and above only a central portion of the wiring layer, and
wherein the detector unit has a diaphragm, and a width of an upper end of the diaphragm is smaller than a distance between the first and second portions of the stress absorbing layer.

2. The physical quantity sensor according to claim 1, characterized in that the metal material is a material having a Young's modulus smaller than that of the wiring layer.

3. The physical quantity sensor according to claim 2, characterized in that the metal material is any one of elements included in a metal group consisting of aluminum, copper, gold, nickel, platinum, and silver, an alloy containing any one of elements included in the metal group, or a compound of any one of elements included in the metal group and silicon.

4. The physical quantity sensor according to claim 1, characterized in that the stress absorbing layer has a stacked structure having a metal film formed from the metal material, and at least one of a titanium nitride film, a titanium tungsten film, and a titanium film.

5. The physical quantity sensor according to claim 1, characterized in that, in the plane parallel to a substrate surface of the semiconductor chip, the stress absorbing layer is formed outside the outer periphery of the diaphragm.

6. The physical quantity sensor according to claim 1, characterized in that the stress absorbing layer is grounded.

7. The physical quantity sensor according to claim 1, characterized by further having a cover layer which is formed between the mold resin portion and the stress absorbing layer, and formed from an insulating film.

8. The physical quantity sensor according to claim 7, characterized in that the cover layer is a silicon oxide film, a silicon nitride film, an aluminum nitride film, a silicon carbide film, or a stacked film thereof.

9. The physical quantity sensor according to claim 7, characterized in that the cover layer is formed at a position excluding the upper end of the diaphragm.

10. The physical quantity sensor according to claim 7, characterized by further having a protective film which covers a region of the stress absorbing layer that is not covered with the cover layer, and is formed from an insulating film.

11. The physical quantity sensor according to claim 10, characterized in that, in the plane parallel to a substrate surface of the semiconductor chip, the protective film is positioned inside the opening.

12. The physical quantity sensor according to claim 1, characterized in that the physical quantity sensor is a thermal type fluid flow sensor,
 the detector unit contains a heating resistance element and a temperature-sensing resistance element, and
 the wiring layer is a layer constituting the heating resistance element or the temperature-sensing resistance element.

* * * * *